US012249292B2

(12) United States Patent
Shen et al.

(10) Patent No.: US 12,249,292 B2
(45) Date of Patent: Mar. 11, 2025

(54) DISPLAY DEVICE AND PROJECTOR

(71) Applicant: Industrial Technology Research Institute, Hsinchu (TW)

(72) Inventors: Hui-Tang Shen, Taoyuan (TW);
Wei-Hung Kuo, Hsinchu (TW);
Kai-Ling Liang, Hsinchu (TW);
Chun-I Wu, Tainan (TW); Yu-Hsiang Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 61 days.

(21) Appl. No.: 18/081,700

(22) Filed: Dec. 15, 2022

(65) Prior Publication Data
US 2024/0127767 A1 Apr. 18, 2024

(30) Foreign Application Priority Data
Oct. 13, 2022 (TW) .................................. 111138908

(51) Int. Cl.
*G09G 3/36* (2006.01)
*G09G 3/00* (2006.01)

(52) U.S. Cl.
CPC ........... *G09G 3/3607* (2013.01); *G09G 3/001* (2013.01); *G09G 2300/023* (2013.01); *G09G 2300/0452* (2013.01)

(58) Field of Classification Search
CPC .............................................. G02F 1/133514
See application file for complete search history.

(56) References Cited

U.S. PATENT DOCUMENTS 6,906,762 B1   6/2005  Witehira et al.
9,870,759 B2   1/2018  Oh et al.
(Continued)

FOREIGN PATENT DOCUMENTS

CN      105280111     1/2018
CN      110161697     8/2019
(Continued)

OTHER PUBLICATIONS

Shiro Suyama et al., "Apparent 3-D image perceived from luminance-modulated two 2-D images displayed at different depths", Vision Research, Jun. 2004, pp. 785-793.
(Continued)

*Primary Examiner* — Nan-Ying Yang
(74) *Attorney, Agent, or Firm* — JCIPRNET (57) ABSTRACT

A display device and a projector are provided. The display device includes a pixel light-emitting panel and multiple color conversion panels. The pixel light-emitting panel includes an N1 number of light-emitting pixel units distributed in an array, and the light-emitting pixel units are driven to emit light through a driver. A first color conversion panel includes an N2 number of first color pixels and an N3 number of first transparent pixels. The first color pixels and the first transparent pixels are disposed relative to the light-emitting pixel units. A second color conversion panel includes an N4 number of second color pixels and an N5 number of second transparent pixels. The second color pixels and the second transparent pixels are disposed relative to the light-emitting pixel units. The lights generated by at least part of the light-emitting pixel units sequentially pass through the first color pixels and the second transparent pixels to achieve the color conversion. The lights generated by at least part of the light-emitting pixel units sequentially
(Continued)

pass through the first transparent pixels and the second color pixels to achieve the color conversion.

20 Claims, 6 Drawing Sheets

(56) References Cited

U.S. PATENT DOCUMENTS

| | | | |
|---|---|---|---|
| 10,701,326 | B1 | 6/2020 | Osmanis et al. |
| 2008/0106629 | A1* | 5/2008 | Kurtz .................... H04N 7/144 |
| | | | 348/E5.022 |
| 2015/0002634 | A1 | 1/2015 | Ishiga et al. |
| 2017/0301288 | A1* | 10/2017 | Perdices-Gonzalez ...................... |
| | | | G09G 3/3208 |
| 2018/0357952 | A1 | 12/2018 | Yang |
| 2019/0326144 | A1* | 10/2019 | Shim ................. H01L 21/67144 |
| 2019/0355288 | A1 | 11/2019 | Choi et al. |
| 2021/0358351 | A1 | 11/2021 | Han |
| 2022/0208042 | A1* | 6/2022 | Lim .................... H04N 13/351 |

FOREIGN PATENT DOCUMENTS

| | | |
|---|---|---|
| JP | H0511240 | 1/1993 |
| JP | 2000075278 | 3/2000 |
| JP | 2009230108 | 10/2009 |
| JP | 2012109549 | 6/2012 |
| JP | 2014145953 | 8/2014 |
| JP | 2020038953 | 3/2020 |
| JP | 6803595 | 12/2020 |
| JP | 2021517351 | 7/2021 |
| JP | 2022032020 | 2/2022 |
| TW | 202121007 | 6/2021 |
| WO | 2017002308 | 1/2017 |

OTHER PUBLICATIONS

Shiro Suyama et al., "Recent developments in DFD (depthfused 3D) display and arc 3D display", Proceedings of SPIE, May 2015, pp. 1-12.

"Office Action of Taiwan Counterpart Application", issued on Jul. 11, 2023, p. 1-p. 10.

"Office Action of Japan Counterpart Application", issued on Oct. 20, 2023, p. 1-p. 5.

* cited by examiner

DISPLAY DEVICE AND PROJECTOR

CROSS-REFERENCE TO RELATED APPLICATION

This application claims the priority benefit of Taiwan application serial no. 111138908, filed on Oct. 13, 2022. The entirety of the above-mentioned patent application is hereby incorporated by reference herein and made a part of this specification.

BACKGROUND

Technical Field

The disclosure relates to a display device and a projector, and more particularly, to a display device and a projector having multiple color conversion panels.

Description of Related Art

In recent years, with the maturity of the display technology, the dynamic effect of the images has been improved, and the color performance and the contrast ratio have also been continuously improved. Therefore, people are pursuing a more realistic and abundant visual enjoyment. It has become a direction of research in the relevant technical field on how to make the images more three-dimensional. One of the technologies applies the principle of the depth-fused display, which is to create a spatial distribution of the images with different distances from the viewer in the design of the display plane of the display. When the pixels on the different planes display the overlapping images of the same size at the same time, there will be differences in the shadow and the color due to the difference in the distance between the image plane and the viewer. At this time, due to the extremely small pixel pitch of the same images on the different planes, it is almost overlapping to the human eye, thereby giving the viewer a three-dimensional feeling of the depth of field due to the difference in the shadow and the color by the different planes.

In the conventional technology, multiple independent display panels are superimposed to achieve the above-mentioned purpose. However, the alignment accuracy between the display panels needs to be very high, thereby resulting in a high manufacturing cost, a poor yield, and also a difficulty to reduce the overall volume.

SUMMARY

The disclosure provides a display device and a projector, which can improve the problems of high cost, poor yield, and bulky volume in the conventional technology.

A display device of the disclosure includes a pixel light-emitting panel and multiple color conversion panels. The pixel light-emitting panel includes an N1 number of light-emitting pixel units distributed in an array, and the light-emitting pixel units are driven to emit light through a driver. The multiple color conversion panels at least include a first color conversion panel and a second color conversion panel. The first color conversion panel includes an N2 number of first color pixels and an N3 number of first transparent pixels. The first color pixels and the first transparent pixels are disposed relative to the light-emitting pixel units. The second color conversion panel includes an N4 number of second color pixels and an N5 number of second transparent pixels. The second color pixels and the second transparent pixels are disposed relative to the light-emitting pixel units. The lights generated by at least part of the light-emitting pixel units sequentially pass through the first color pixels and the second transparent pixels to achieve the color conversion. The lights generated by at least part of the light-emitting pixel units sequentially pass through the first transparent pixels and the second color pixels to achieve the color conversion.

A projector of the disclosure includes a pixel light-emitting panel, multiple color conversion panels, and a projection lens. The pixel light-emitting panel includes the N1 number of light-emitting pixel units distributed in an array, and the light-emitting pixel units are driven to emit light through a driver. The multiple color conversion panels at least include a first color conversion panel and a second color conversion panel. The first color conversion panel includes an N2 number of first color pixels and an N3 number of first transparent pixels. The first color pixels and the first transparent pixels are disposed relative to the light-emitting pixel units. The second color conversion panel includes an N4 number of second color pixels and an N5 number of second transparent pixels. The second color pixels and the second transparent pixels are disposed relative to the light-emitting pixel units. The lights generated by at least part of the light-emitting pixel units sequentially pass through the first color pixels and the second transparent pixels to achieve the color conversion. The lights generated by at least part of the light-emitting pixel units sequentially pass through the first transparent pixels and the second color pixels to achieve the color conversion. The lights generated by the light-emitting pixel units project an image after passing through the first color conversion panel, the second color conversion panel, and the projection lens.

Based on the above, in the display device and the projector of the disclosure, the single pixel light-emitting panel is used with the multiple color conversion panels to achieve the depth-fused display, which may reduce the cost and the volume and improve the yield.

DESCRIPTION OF THE EMBODIMENTS

Figure 1:
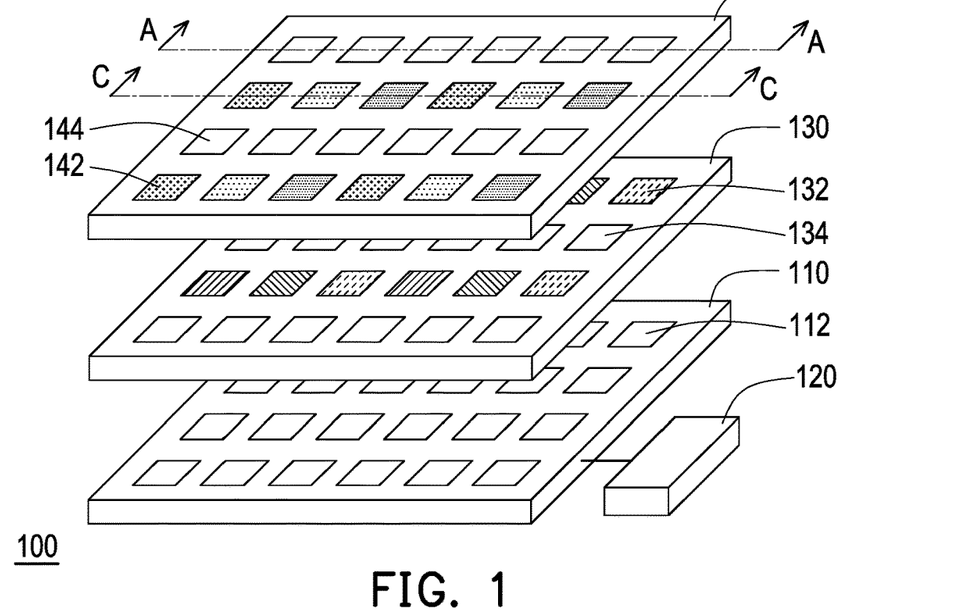
FIG. 1 is a schematic exploded view of a display device according to an embodiment of the disclosure.

FIG. 1 is a schematic exploded view of a display device according to an embodiment of the disclosure. Please refer to FIG. 1. A display device 100 of the embodiment includes a pixel light-emitting panel 110 and multiple color conversion panels 130 and 140. The pixel light-emitting panel 110 includes an N1 number of light-emitting pixel units 112 distributed in an array, and the light-emitting pixel units 112 are driven to emit light through a driver 120 (only shown in FIG. 1). The multiple color conversion panels 130 and 140 at least include a first color conversion panel 130 and a second color conversion panel 140. The first color conversion panel 130 includes an N2 number of first color pixels 132 and an N3 number of first transparent pixels 134. The first color pixels 132 and the first transparent pixels 134 are disposed relative to the light-emitting pixel units 112. The second color conversion panel 140 includes an N4 number of second color pixels 142 and an N5 number of second transparent pixels 144. The second color pixels 142 and the second transparent pixels 144 are disposed relative to the light-emitting pixel units 112. The lights generated by at least part of the light-emitting pixel units 112 sequentially pass through the first color pixels 132 and the second transparent pixels 144 to achieve the color conversion, for example, to form a rear image. The lights generated by at least part of the light-emitting pixel units 112 sequentially pass through the first transparent pixels 134 and the second color pixels 142 to achieve the color conversion, for example, to form a front image.

In the display device 100 of the embodiment, the first color conversion panel 130 and the second color conversion panel 140 are sequentially superimposed on the pixel light-emitting panel 110. A part of the light-emitting pixel units 112 of the pixel light-emitting panel 110 is used for displaying a monochrome front image, and another part of the light-emitting pixel units 112 is used for displaying a monochrome rear image. The monochrome front image is converted into a color front image after passing through the first color conversion panel 130. The monochrome rear image is converted into a color rear image after passing through the second color conversion panel 140. For the user, the rear image composed of the first color pixels 132 is seen at the position of the first color conversion panel 130, and the front image composed of the second color pixels 142 is seen at the position of the second color conversion panel 140. Since there are slight differences in the brightness/darkness and/or the color between the front image and the rear image, the user can feel the depth of field of the image, thereby producing the effect of viewing a three-dimensional image.

For example, before the image is sent to the driver 120, the original single image is programmed into a front image signal and a rear image signal. Then, through the driver 120, the front image signal and the rear image signal are respectively presented in the form of a monochrome color by the light-emitting pixel units 112 of different groups of the pixel light-emitting panel 110, and then presented in color by the first color conversion panel 130 and the second color conversion panel 140. Since the first color pixels 132 and the second color pixels 142 are alternately arranged and the distance between the pixels is extremely small, the front image and the rear image may be regarded as overlapping images for the user. When the images are programmed, the difference in the brightness between the front image and the rear image may be adjusted according to the depth of field characteristics of the input image. Due to the thickness of the first color conversion panel 130 and the second color conversion panel 140, the front image and the rear image have different spatial depths. The difference in the distance between the image plane and the user, in addition to the slight difference in the brightness/darkness and/or the color of the front image and the rear image, gives the user a depth-fused three-dimensional feeling.

Since there is only one pixel light-emitting panel 110 in the entire display device 100, the overall volume may be greatly reduced. In addition, the positions of the first color pixels 132 and the second color pixels 142 are staggered. The two may be displayed at the same time, and it is not necessary to display the front image and the rear image in turn by means of the timing control, which may also reduce the complexity of the driving circuit. Moreover, the cost of the display device 100 is reduced and the yield is improved.

Figure 2:
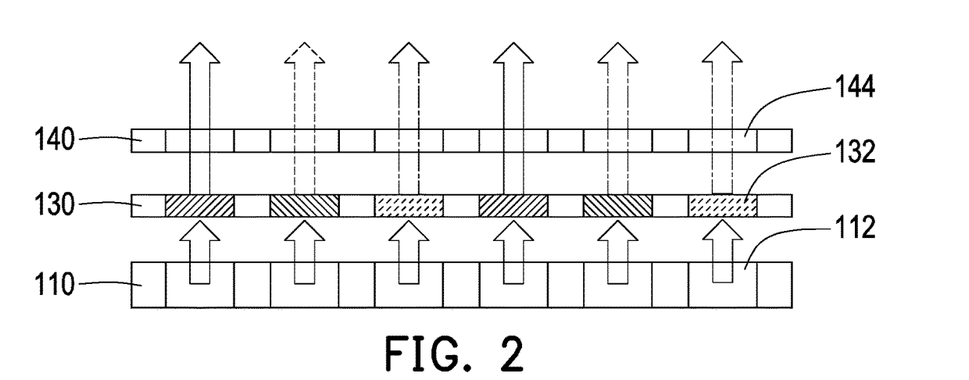
FIG. 2 is a schematic cross-sectional view of the display device of FIG. 1 along line A-A.
Figure 3:
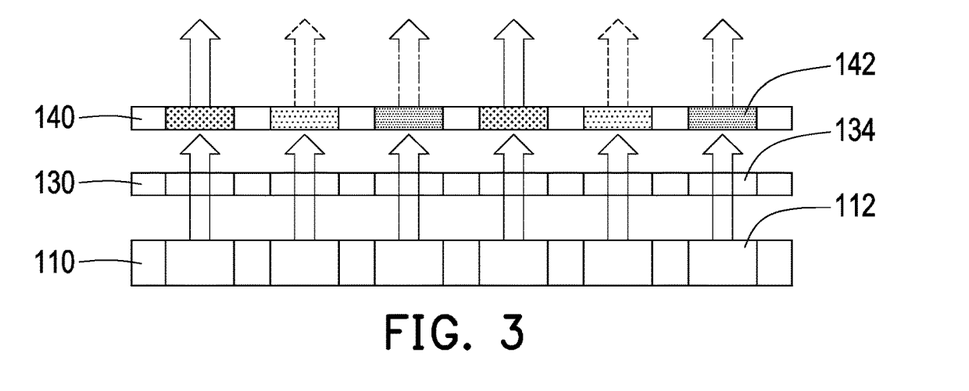
FIG. 3 is a schematic cross-sectional view of the display device of FIG. 1 along line C-C.

FIG. 2 is a schematic cross-sectional view of the display device of FIG. 1 along line A-A. FIG. 3 is a schematic cross-sectional view of the display device of FIG. 1 along line C-C. Please refer to FIG. 2 and FIG. 3. In the embodiment, the light-emitting pixel units 112 are light-emitting diode chips. The sizes of the light-emitting pixel units 112 are, for example, less than 100 microns. The first color pixels 132 and the second color pixels 142 are quantum dot layers, but may also be color light filter films or phosphor layers. The color pixel does not emit light by itself, but when the color pixel is excited by light, it will emit the corresponding wavelength of light according to the material properties of the color pixel. The material for each color pixel may be a single color conversion material or a suitable combination of multiple color conversion materials, for example, the combination of a red quantum dot material and a red color light filter film material. The color of each first color pixel 132 may be red, blue, or green. The color of each second color pixel 142 may be red, blue, or green. For example, the light-emitting pixel units 112 emit blue light, but the light-emitting pixel units 112 may also emit white light, ultraviolet light, or other lights. The blue light emitted by at least a part of the light-emitting pixel units 112 may be converted into red light, blue light, and green light through the first color pixels 132. The red light, the blue light, and the green light then pass through the second transparent pixels 144 to reach the user's eyes and form the rear image. The substrate materials of the first color conversion panel 130 and the second color conversion panel 140 have, for example, light-transmitting properties in the visible light wavelength band.

Please refer to FIG. 3. The blue light emitted by at least a part of the light-emitting pixel units 112 may first pass through the first transparent pixels 134 to reach the second color pixels 142, and then be converted into the red light, the blue light, and the green light through the second color pixels 142. The red light, the blue light, and the green light then reach the user's eye and form the front image.

Figure 4:
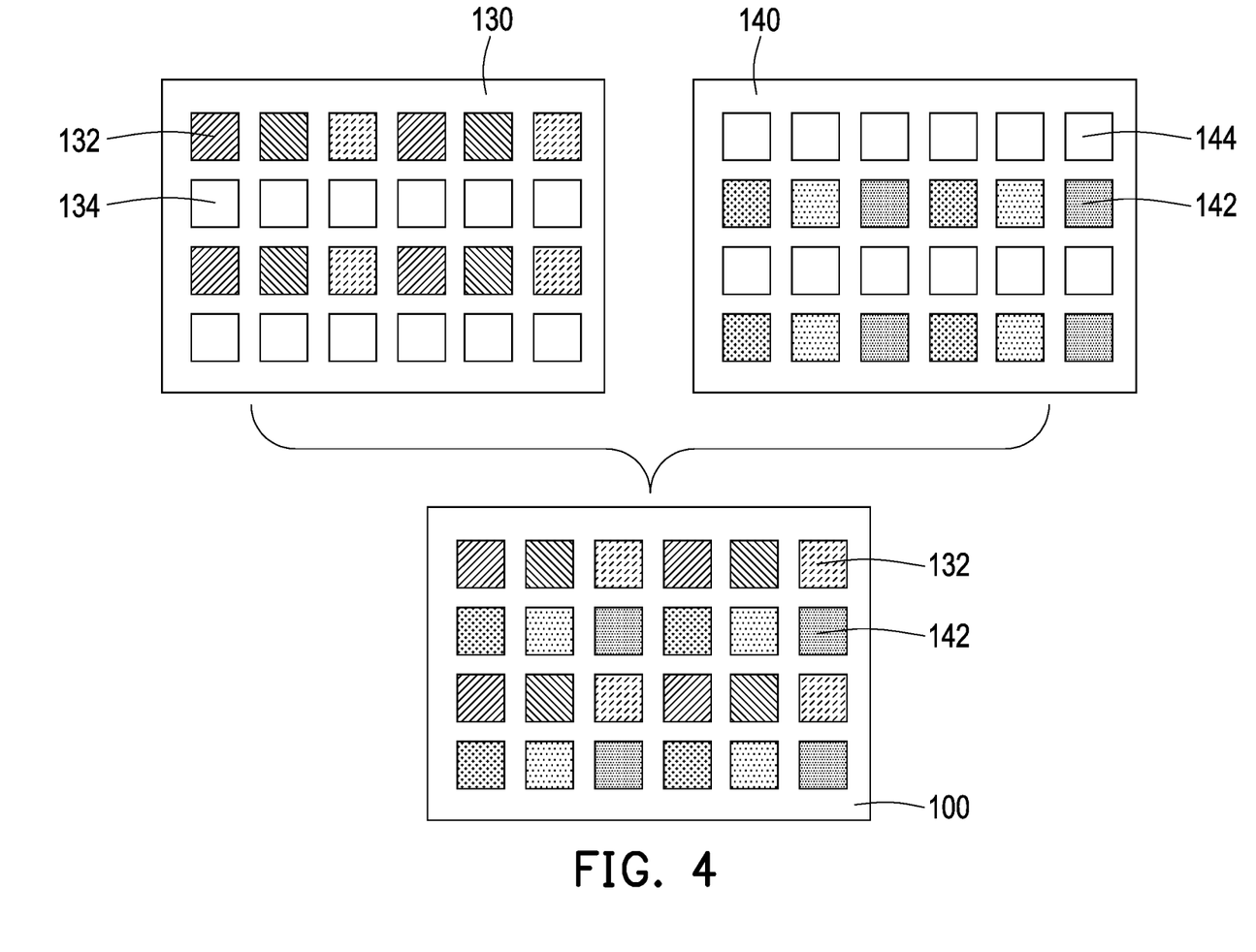
FIG. 4 is a schematic view of an alignment relationship between two color conversion panels of the display device of FIG. 1.

FIG. 4 is a schematic view of an alignment relationship between two color conversion panels of the display device of FIG. 1. Please refer to FIG. 4. In the embodiment, N2=N5 and N3=N4. That is, the number of the first color pixels 132 is the same as the number of the second transparent pixels 144, and the number of the first transparent pixels 134 is the same as the number of the second color pixels 142. In the embodiment, the first color pixels 132 and the first transparent pixels 134 are alternately arranged.

In the embodiment, the first color pixels 132 and the first transparent pixels 134 are alternately arranged in rows and columns. For example, the odd-numbered columns are the first color pixels 132 and the even-numbered columns are the first transparent pixels 134. After superimposing the first color conversion panel 130 and the second color conversion panel 140, it may be seen that the position of the first color pixels 132 is opposite to the position of the second transparent pixels 144, and the position of the first transparent pixels 134 is opposite to the position of the second color pixels 142. Therefore, the odd-numbered columns are the second transparent pixels 144 and the even-numbered columns are the second color pixels 142. Moreover, the first color pixels 132 and the second color pixels 142 are evenly distributed on the entire display device 100.

Figure 5A:
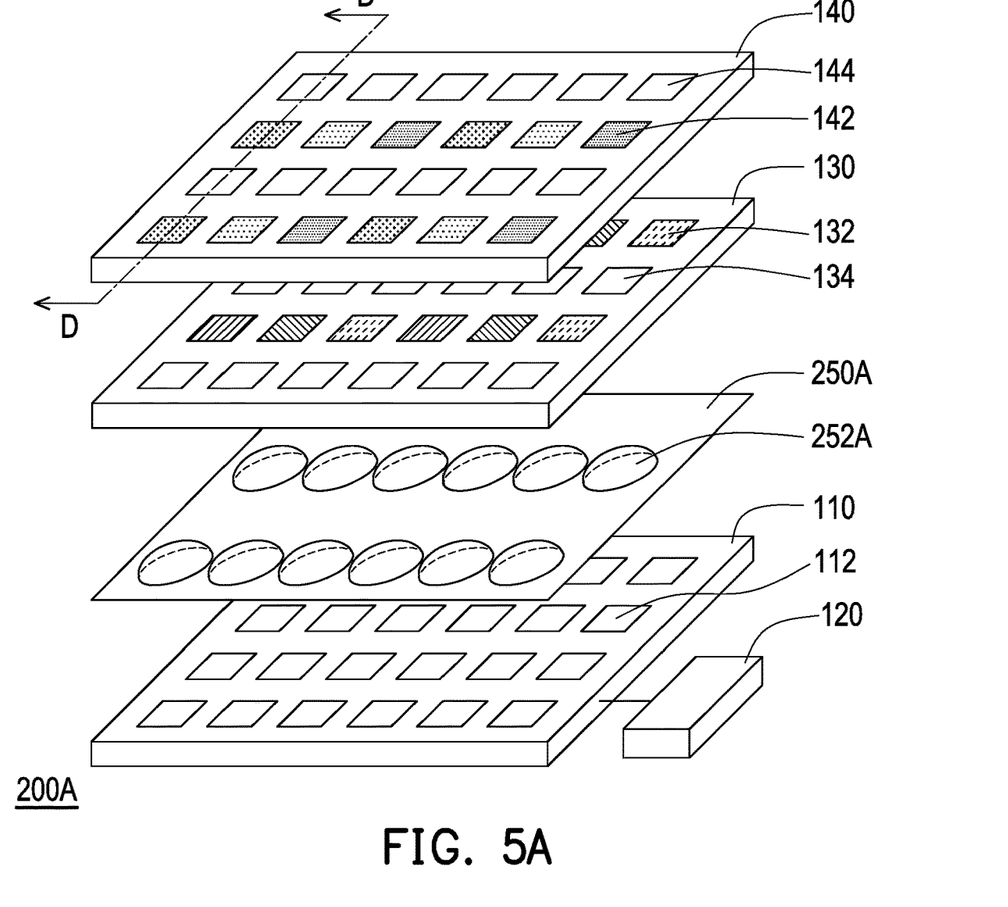
FIG. 5A is a schematic exploded view of a display device according to another embodiment of the disclosure.
Figure 5B:
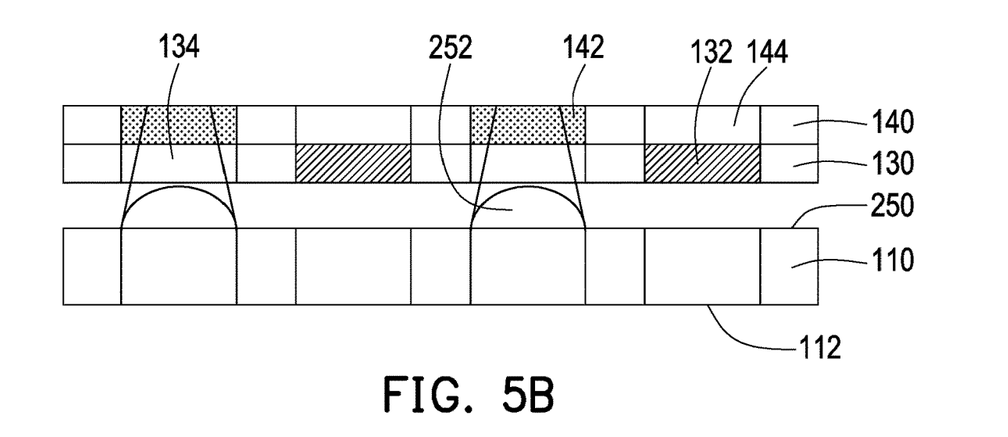
FIG. 5B is a schematic cross-sectional view along line D-D of the display device of FIG. 5A in an assembled state.

FIG. 5A is a schematic exploded view of a display device according to another embodiment of the disclosure. FIG. 5B is a schematic cross-sectional view along line D-D of the display device of FIG. 5 in an assembled state. Please refer to FIGS. 5A and 5B. A display device 200A of the embodiment is similar to the display device 100 of FIG. 1, and only the differences between the two are described here. In the embodiment, the display device 200A further includes a light-condensing device 250A disposed between the pixel light-emitting panel 110 and the first color conversion panel 130. The light-condensing device 250A may cause the light emitted by the light-emitting pixel units 112 to produce a focusing effect, so that the amount of light incident on the second color pixels 142 is increased to improve the efficiency of excitation, and the possibility of the light emitted by the light-emitting pixel units 112 diffusing to the adjacent first color pixels 132 is reduced to decrease light-crossing effect. Here, the light emitted by the light-emitting pixel units 112 is caused to produce the focusing effect. In other embodiments, the light-condensing device 250A may also be replaced by a collimating device. The collimating device includes multiple collimating units. Each collimating unit corresponds to a second color pixel 142. The collimating unit may decrease the divergence angle of the light emitted by the light-emitting pixel units 112. The light-condensing device 250A of the embodiment has multiple light-condensing units 252A. Each light-condensing unit 252A corresponds to a second color pixel 142. The light-condensing units 252A may be not only convex lens, but also metalens, or other optical devices.

Since the distance between the second color pixels 142 and the light-emitting pixel units 112 is greater than the distance between the first color pixels 132 and the light-emitting pixel units 112, only the light-condensing units 252A are used in the embodiment to correspond to the second color pixels 142 and produce the light-focusing effect, but the disclosure is not limited hereto. In addition, the light-condensing device 250A may also be formed by a part of the top of the light-emitting pixel units 112. That is, the top of the light-emitting pixel units 112 is made to have a convex lens shape.

Figure 6:
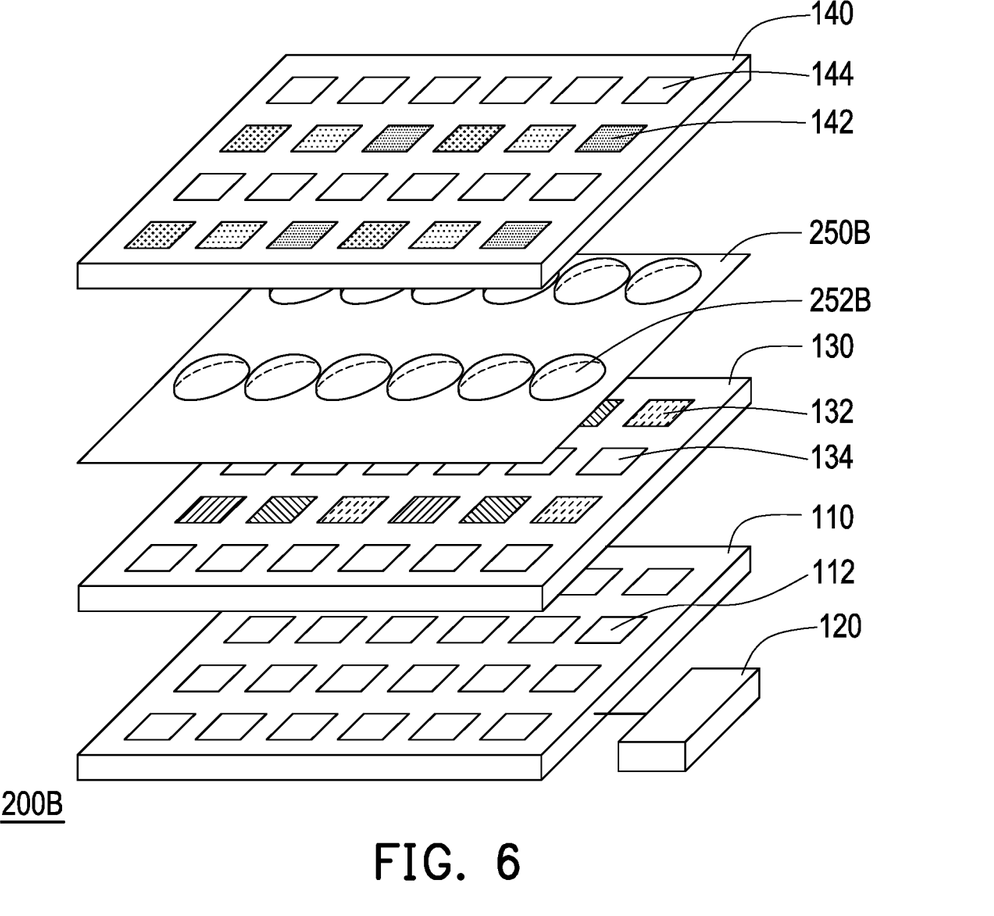
FIG. 6 is a schematic exploded view of a display device according to a further embodiment of the disclosure.

FIG. 6 is a schematic exploded view of a display device according to a further embodiment of the disclosure. Please refer to FIG. 6. A display device 200B of the embodiment is similar to the display device 200A of FIG. 5A. and only the differences between the two are described here. In the embodiment, a light-condensing device 250B is disposed between the first color conversion panel 130 and the second color conversion panel 140. Each light-condensing unit 252B of the light-condensing device 250B corresponds to a first color pixel 132. The light-condensing device 250B may cause the color light converted by the first color pixels 132 to produce a focusing effect, so that the possibility of the converted color light diffusing to the adjacent second color pixels 142 is reduced.

Figure 7:
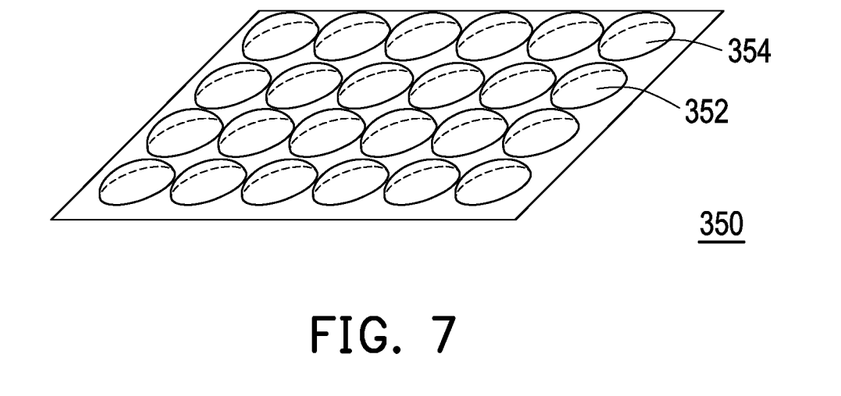
FIG. 7 is a schematic view of a light-condensing device of a display device according to yet another embodiment of the disclosure.

FIG. 7 is a schematic view of a light-condensing device of a display device according to yet another embodiment of the disclosure. Please refer to FIG. 5 and FIG. 7. The display device of the embodiment is similar to the display device 200A of FIG. 5, except that the light-condensing device 250A of FIG. 5 is replaced with a light-condensing device 350 of the embodiment. The light-condensing device 350 of the embodiment has multiple light-condensing units 352 and multiple light-condensing units 354. The light-condensing units 352 are used to correspond to the second color pixels 142, and the light-condensing units 354 are used to correspond to the first color pixels 132. The light-condensing device 350 may cause the light emitted by the light-emitting pixel units 112 to produce a focusing effect, so that the amount of light incident on the first color pixels 132 and the second color pixels 142 is increased to improve the efficiency of excitation. Since the distance between the first color pixels 132 and the light-emitting pixel units 112 and the distance between the second color pixels 142 and the light-emitting pixel units 112 are different, the light-focusing capabilities of the light-condensing units 352 and the light-condensing units 354 are different. Taking the light-condensing unit in the form of a convex lens as an example, the radian of the arc surface of the light-condensing units 352 corresponding to the second color pixels 142 and the radian of the arc surface of the light-condensing units 354 corresponding to the first color pixels 132 are different. In other embodiments, the light-condensing device 350 may also be replaced by a collimating device. The collimating device includes multiple collimating units. The collimating units correspond to the first color pixels 132 and the second color pixels 142. The collimating unit may decrease the divergence angle of the light emitted by the light-emitting pixel units 112. In other embodiments, the light-condensing device 350 may be disposed above the second color conversion panel 140. The light-condensing units of the light-condensing device 350 corresponding to the second color pixels 142 and the light-condensing units of the light-condensing device 350 corresponding to the first color pixels 132 have arc surfaces with different values of radian, respectively.

Figure 8:
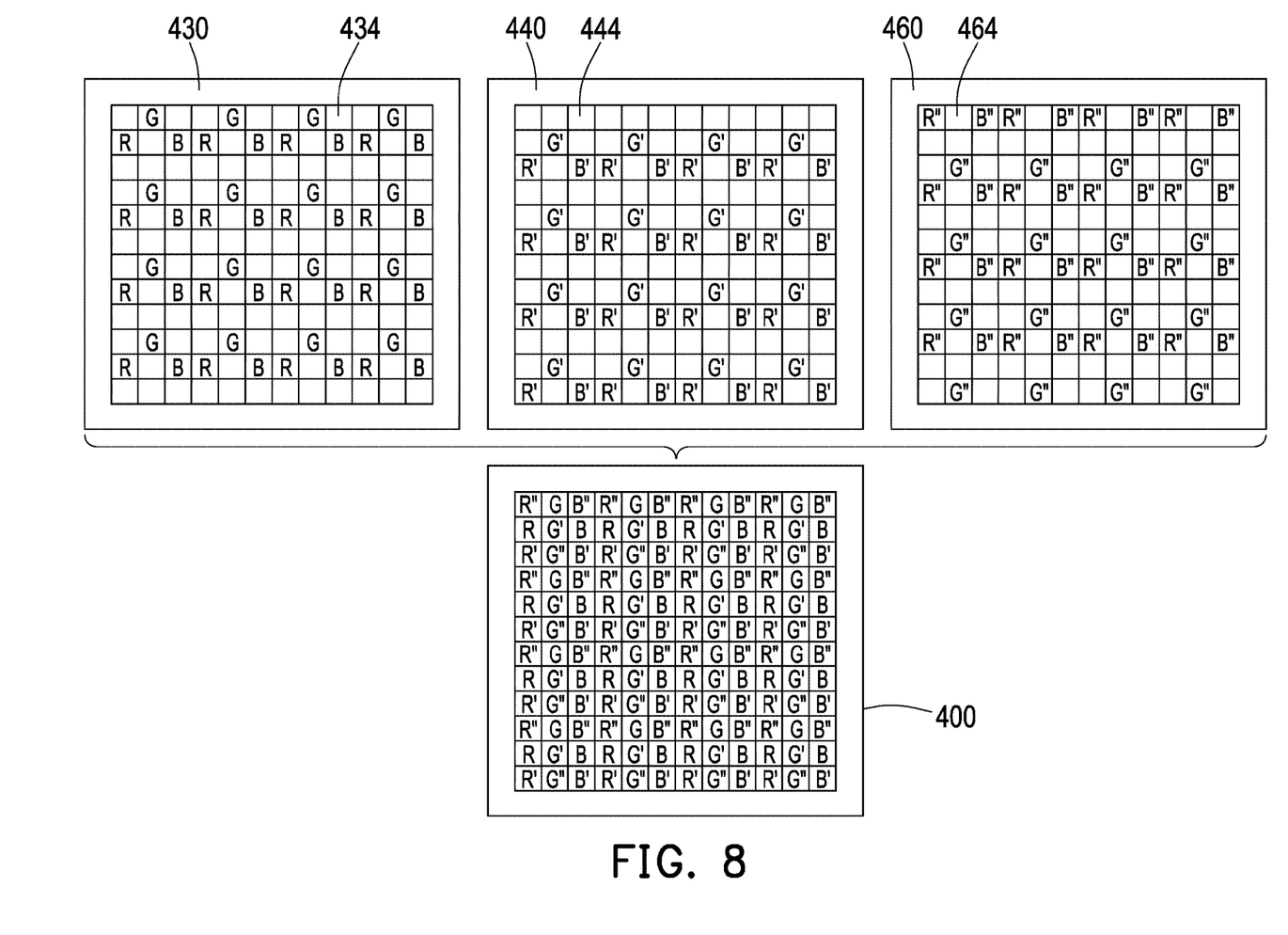
FIG. 8 is a schematic view of an alignment relationship of three color conversion panels of a display device according to still another embodiment of the disclosure.

FIG. 8 is a schematic view of an alignment relationship of three color conversion panels of a display device according to still another embodiment of the disclosure. Please refer to FIG. 8. In the embodiment, the pixel light-emitting panel further includes a third color conversion panel 460. The first color conversion panel 430 includes an N2 number of first color pixels R, first color pixels G, first color pixels B, and an N3 number of first transparent pixels 434. The second color conversion panel 440 includes an N4 number of second color pixels R', second color pixels G', second color pixels B', and an N5 number of second transparent pixels 444. The third color conversion panel 460 includes an N6 number of third color pixels R", third color pixels G", third color pixels B", and an N7 number of third transparent pixels 464. The lights generated by at least part of the light-emitting pixel units (such as the light-emitting pixel units 112 shown in FIG. 1) sequentially pass through the first color pixels R, the first color pixels G, the first color pixels B, the second transparent pixels 444, and the third transparent pixels 464 to achieve the color conversion. The lights generated by at least part of the light-emitting pixel units sequentially pass through the first transparent pixels 434, the second color pixels R', the second color pixels G', the second color pixels B', and the third transparent pixels 464 to achieve the color conversion. The lights generated by at least part of the light-emitting pixel units sequentially pass through the first transparent pixels 434, the second transparent pixels 444, and the third color pixels R", the third color pixels G", the third color pixels B" to achieve the color conversion. N3=N4+N6, N5=N2+N6, and N7=N2+N4.

In the embodiment, the three color conversion panels may provide the images with three different feelings of distance, which further enhances the three-dimensional and layering feeling of the images. Indeed, in other embodiments, the number of the color conversion panels may be further increased. The positions of the color pixels on each of the multiple color conversion panels are different. However, the positions of the color pixels on any of the color conversion panels must overlap with the positions of the transparent pixels on the other color conversion panels. After the multiple color conversion panels are stacked, all pixel positions correspond to one color pixel, and the color pixels of the different color conversion panels are arranged in an alternate manner.

Figure 9:
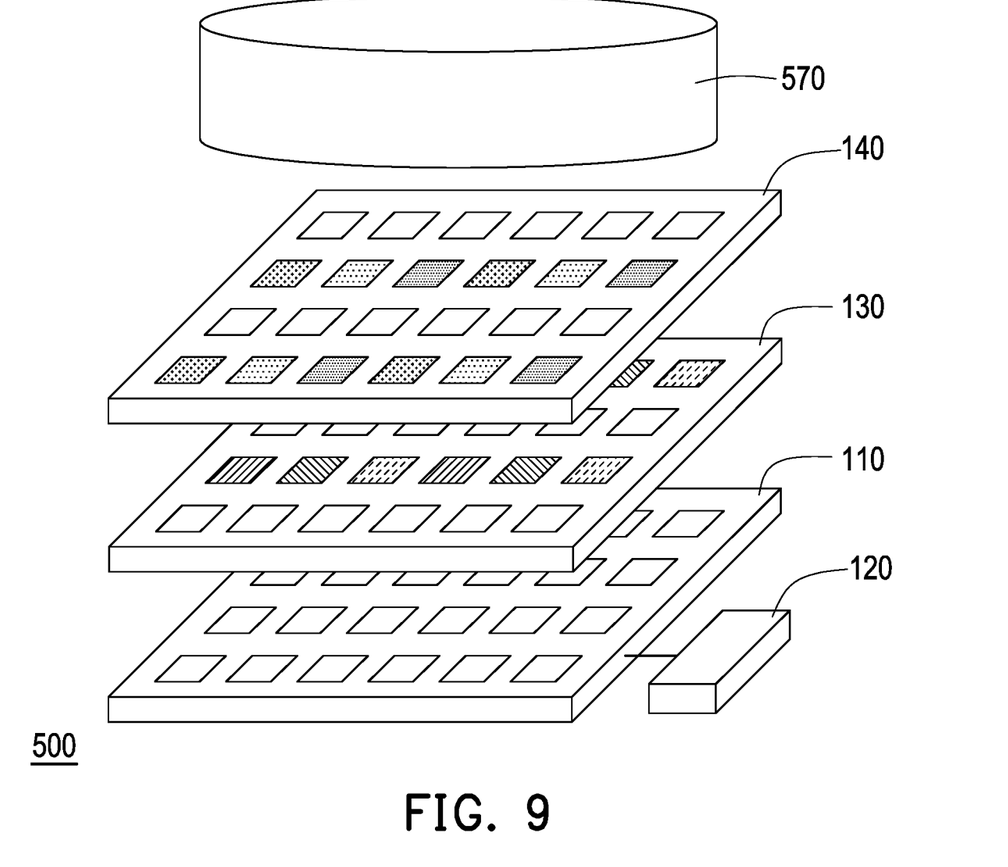
FIG. 9 is a schematic exploded view of a projector according to an embodiment of the disclosure.

FIG. 9 is a schematic exploded view of a projector according to an embodiment of the disclosure. Please refer to FIG. 9. A projector 500 of the embodiment has an additional projection lens 570 compared with the display devices of the foregoing embodiments. That is, the display devices of the foregoing embodiments may all be applied to the projector 500 of the embodiment, and only the pixel light-emitting panel 110, the multiple color conversion panels 130 and 140, and the driver 120 of the display device of FIG. 1 are applied here as an example, but the disclosure is not limited hereto.

The lights generated by at least part of the light-emitting pixel units 112 sequentially pass through the first color pixels 132 and the second transparent pixels 144 to achieve the color conversion, for example, to form the rear image. The lights generated by at least part of the light-emitting pixel units 112 sequentially pass through the first transparent pixels 134 and the second color pixels 142 to achieve the color conversion, for example, to form the front image. The lights generated by the light-emitting pixel units 112 project an image through the first color conversion panel 130, the second color conversion panel 140, and the projection lens 570.

For example, the projector 500 of the embodiment may be a projector in a micro display field, such as a virtual reality display, an augmented reality display, a head-up display, etc., but the invention is not limited hereto. The projector 500 of the embodiment may provide the image with the depth of field, thereby producing the effect of viewing a three-dimensional image.

To sum up, in the display device and the projector of the disclosure, the single pixel light-emitting panel is used with the multiple color conversion panels to achieve the depth-fused display. The manufacturing process and the structure may be simplified. The cost may be reduced, the yield may be improved, and the volume may be reduced. In addition, compared to controlling the image of the multiple pixel light-emitting panels at the same time, it is only necessary to control the image of the single pixel light-emitting panel, which reduces the complexity of image correction and alignment.

What is claimed is:

1. A display device, comprising:
   a pixel light-emitting panel, comprising an N1 number of light-emitting pixel units distributed in an array, wherein the light-emitting pixel units are driven to emit light through a driver; and
   a plurality of color conversion panels, comprising at least a first color conversion panel, a second color conversion panel and a third color conversion panel, wherein
   the first color conversion panel comprises an N2 number of first color pixels and an N3 number of first transparent pixels, the first color pixels and the first transparent pixels are disposed relative to the light-emitting pixel units,
   the second color conversion panel comprises an N4 number of second color pixels and an N5 number of second transparent pixels, the second color pixels and the second transparent pixels are disposed relative to the light-emitting pixel units, lights generated by at least part of the light-emitting pixel units sequentially pass through the first color pixels and the second transparent pixels to achieve a color conversion to form a color front image, and lights generated by at least part of the light-emitting pixel units sequentially pass through the first transparent pixels and the second color pixels to achieve a color conversion to form a color rear image, and
   the third color conversion panel comprises an N6 number of third color pixels and an N7 number of third transparent pixels, the lights generated by at least part of the light-emitting pixel units sequentially pass through the first transparent pixels, the second transparent pixels, and the third color pixels to achieve the color conversion, and N3=N4+N6, N5=N2+N6, N7=N2+N4.

2. The display device according to claim 1, wherein N2=N5 and N3=N4.

3. The display device according to claim 1, wherein colors of the first color pixels comprise red, blue, or green.

4. The display device according to claim 1, wherein the first color pixels and the second color pixels are quantum dot layers, color light filter films, or phosphor layers.

5. The display device according to claim 1, wherein the first color pixels and the first transparent pixels are alternately arranged in rows and columns.

6. The display device according to claim 1, wherein sizes of the light-emitting pixel units are less than 100 microns, and the light-emitting pixel units are light-emitting diode chips.

7. The display device according to claim 1, further comprising a light-condensing device disposed between the pixel light-emitting panel and the first color conversion panel, wherein the light-condensing device has a plurality of light-condensing units, and the light-condensing units are disposed corresponding to the second color pixels.

8. The display device according to claim 1, further comprising a light-condensing device disposed between the pixel light-emitting panel and the first color conversion panel, wherein the light-condensing device has a plurality of light-condensing units, and the light-condensing units of the light-condensing device corresponding to the second color pixels and the light-condensing units of the light-condensing device corresponding to the first color pixels have arc surfaces with different values of radian, respectively.

9. The display device according to claim 1, further comprising a light-condensing device disposed between the first color conversion panel and the second color conversion panel, wherein the light-condensing device has a plurality of light-condensing units, and the light-condensing units are disposed corresponding to the first color pixels.

10. A projector, comprising:
   a pixel light-emitting panel, comprising an N1 number of light-emitting pixel units distributed in an array, wherein the light-emitting pixel units are driven to emit light through a driver;
   a plurality of color conversion panels, comprising at least a first color conversion panel, a second color conversion panel and a third color conversion panel, wherein
   the first color conversion panel comprises an N2 number of first color pixels and an N3 number of first transparent pixels, the first color pixels and the first transparent pixels are disposed relative to the light-emitting pixel units, the second color conversion panel comprises an N4 number of second color pixels and an N5 number of second transparent pixels, the second color pixels and the second transparent pixels are disposed relative to the light-emitting pixel units, lights generated by at least part of the light-emitting pixel units sequentially pass through the first color pixels and the second transparent pixels to achieve a color conversion to form a color front image, and lights generated by at least part of the light-emitting pixel units sequentially pass through the first transparent pixels and the second color pixels to achieve a color conversion to form a color rear image, and the third color conversion panel comprises an N6 number of third color pixels and an N7 number of third transparent pixels, the lights generated by at least part of the light-emitting pixel units sequentially pass through the first transparent pixels, the second transparent pixels and the third color pixels to achieve the color conversion, and N3=N4+N6, N5=N2+N6, N7=N2+N4; and a projection lens, wherein the lights generated by the light-emitting pixel units pass through the first color conversion panel, the second color conversion panel, the third color conversion panel and the projection lens to project an image.

11. The projector according to claim 10, wherein N2=N5 and N3=N4.

12. The projector according to claim 10, wherein colors of the first color pixels comprise red, blue, or green.

13. The projector according to claim 10, wherein the first color pixels and the second color pixels are quantum dot layers, color light filter films, or phosphor layers.

14. The projector according to claim 10, wherein the first color pixels and the first transparent pixels are alternately arranged in rows and columns.

15. The projector according to claim 10, wherein sizes of the light-emitting pixel units are less than 100 microns, and the light-emitting pixel units are light-emitting diode chips.

16. The projector according to claim 10, further comprising a light-condensing device disposed between the pixel light-emitting panel and the first color conversion panel, wherein the light-condensing device has a plurality of light-condensing units, and the light-condensing units are disposed corresponding to the second color pixels.

17. The projector according to claim 10, further comprising a light-condensing device disposed between the pixel light-emitting panel and the first color conversion panel, wherein the light-condensing device has a plurality of light-condensing units, and the light-condensing units of the light-condensing device corresponding to the second color pixels and the light-condensing units of the light-condensing device corresponding to the first color pixels have arc surfaces with different values of radian, respectively.

18. The projector according to claim 10, further comprising a light-condensing device disposed between the first color conversion panel and the second color conversion panel, wherein the light-condensing device has a plurality of light-condensing units, and the light-condensing units are disposed corresponding to the first color pixels.

19. A display device, comprising:
a pixel light-emitting panel, comprising an N1 number of light-emitting pixel units distributed in an array, wherein the light-emitting pixel units are driven to emit light through a driver; and a plurality of color conversion panels, comprising at least a first color conversion panel, a second color conversion panel and a third color conversion panel, wherein the first color conversion panel is disposed between the pixel light-emitting panel and the second color conversion panel, the first color conversion panel comprises an N2 number of first color pixels and an N3 number of first transparent pixels, the first color pixels and the first transparent pixels are disposed relative to the light-emitting pixel units, the second color conversion panel comprises an N4 number of second color pixels and an N5 number of second transparent pixels, the second color pixels and the second transparent pixels are disposed relative to the light-emitting pixel units, lights generated by at least part of the light-emitting pixel units sequentially pass through the first color pixels and the second transparent pixels to achieve a color conversion to form a color front image, and lights generated by at least part of the light-emitting pixel units sequentially pass through the first transparent pixels and the second color pixels to achieve a color conversion to form a color rear image, and the third color conversion panel comprises an N6 number of third color pixels and an N7 number of third transparent pixels, the lights generated by at least part of the light-emitting pixel units sequentially pass through the first transparent pixels, the second transparent pixels, and the third color pixels to achieve the color conversion, and N3=N4+N6, N5=N2+N6, N7=N2+N4.

20. A projector, comprising:
a pixel light-emitting panel, comprising an N1 number of light-emitting pixel units distributed in an array, wherein the light-emitting pixel units are driven to emit light through a driver;

a plurality of color conversion panels, comprising at least a first color conversion panel, a second color conversion panel and a third color conversion panel, wherein the first color conversion panel is disposed between the pixel light-emitting panel and the second color conversion panel, the first color conversion panel comprises an N2 number of first color pixels and an N3 number of first transparent pixels, the first color pixels and the first transparent pixels are disposed relative to the light-emitting pixel units, the second color conversion panel comprises an N4 number of second color pixels and an N5 number of second transparent pixels, the second color pixels and the second transparent pixels are disposed relative to the light-emitting pixel units, lights generated by at least part of the light-emitting pixel units sequentially pass through the first color pixels and the second transparent pixels to achieve a color conversion to form a color front image, and lights generated by at least part of the light-emitting pixel units sequentially pass through the first transparent pixels and the second color pixels to achieve a color conversion to form a color rear image, and the third color conversion panel comprises an N6 number of third color pixels and an N7 number of third transparent pixels, the lights generated by at least part of the light-emitting pixel units sequentially pass through the first transparent pixels, the second transparent pixels and the third color pixels to achieve the color conversion, and N3=N4+N6, N5=N2+N6, N7=N2+N4; and a projection lens, wherein the lights generated by the light-emitting pixel units pass through the first color conversion panel, the second color conversion panel, the third color conversion panel and the projection lens to project an image.

* * * * *